United States Patent
Kim et al.

[11] Patent Number: 6,027,301
[45] Date of Patent: Feb. 22, 2000

[54] SEMICONDUCTOR WAFER TESTING APPARATUS WITH A COMBINED WAFER ALIGNMENT/WAFER RECOGNITION STATION

[75] Inventors: Yu Kweon Kim; Dong Ho Kim, both of Suwon, Rep. of Korea

[73] Assignee: Samsung Electronics Co., Ltd., Suwon, Rep. of Korea

[21] Appl. No.: 08/938,311

[22] Filed: Sep. 26, 1997

[30] Foreign Application Priority Data

Oct. 4, 1996 [KR] Rep. of Korea .................... 96-43984

[51] Int. Cl.[7] .................................................. B65G 49/07
[52] U.S. Cl. ............... 414/416; 414/222.01; 414/222.07; 414/936; 414/937; 414/940; 250/559.44; 340/674; 198/394; 269/903; 364/478.14
[58] Field of Search ................................. 414/416, 222.01, 414/222.07, 222.12, 225.01, 226.05, 936, 937, 938, 940; 198/394; 364/478.03, 478.14; 269/903; 250/559.44; 340/568, 674

[56] References Cited

U.S. PATENT DOCUMENTS

| | | | |
|---|---|---|---|
| 4,859,993 | 8/1989 | Kagami et al. ...................... | 269/903 |
| 4,938,655 | 7/1990 | Asano ................................. | 414/416 |
| 4,987,407 | 1/1991 | Lee ..................................... | 340/674 |
| 5,183,378 | 2/1993 | Asano et al. ........................ | 414/757 |
| 5,206,627 | 4/1993 | Kato ................................... | 340/568 |
| 5,418,382 | 5/1995 | Blackwood et al. ................. | 250/561 |
| 5,504,345 | 4/1996 | Bartunek et al. .................... | 250/559.4 |
| 5,513,948 | 5/1996 | Bacchi et al. ....................... | 198/394 |
| 5,551,829 | 9/1996 | Jerolimov et al. .................. | 198/394 |
| 5,743,699 | 4/1998 | Ishihara .............................. | 414/938 |
| 5,853,284 | 12/1998 | Ohzeki et al. ..................... | 414/936 |
| 5,880,479 | 3/1999 | Wang ................................. | 414/936 |

FOREIGN PATENT DOCUMENTS 403270253 12/1991 Japan ................................. 414/936

*Primary Examiner*—Douglas Hess
*Attorney, Agent, or Firm*—Jones Volentine, LLP

[57] ABSTRACT

A semiconductor wafer testing apparatus has a work table on which a carrier containing semiconductor wafers to be checked is placed. The work table is equipped for combined wafer alignment and wafer code recognition while the wafers remain in their carrier in one position on the work table. The alignment is accomplished with a wafer flat zone aligner which has a pair of roller pins each coming in contact with circumferences of the wafers being stacked in the carrier through an open lower part of the carrier and an opening in the table. The wafer code recognition is accomplished with an optical character recognizer that moves up and down and forward and backward with respect to the carrier, and interposes between the wafers in the carrier so as to read out codes which are on each wafer. This combined automated work station helps prevent contamination of the wafers by an operator or by unnecessary handling of the wafers, and also reduces cycle time for the entire inspection process.

8 Claims, 5 Drawing Sheets

SEMICONDUCTOR WAFER TESTING APPARATUS WITH A COMBINED WAFER ALIGNMENT/WAFER RECOGNITION STATION

BACKGROUND OF THE INVENTION

1. Field of the Invention

The present invention relates generally to a semiconductor wafer testing apparatus. More particularly, it relates to an improved semiconductor wafer testing apparatus which has an automated station in which both wafer alignment and wafer recognition are performed under automatic control before a wafer test, without having to move the wafers to two separate stations.

2. Background of the Related Art

For each step in semiconductor device fabrication, a testing apparatus is used to inspect and measure the devices upon completion of the corresponding process. Generally, one wafer that has already undergone a prescribed process of fabrication is preselected to be placed under sampling inspection in the semiconductor wafer testing apparatus.

The sampling inspection procedure of the conventional wafer testing apparatus is now described with reference to FIG. 1.

The sampling inspection begins with loading a carrier full of semiconductor wafers which have undergone a prescribed process onto a wafer alignment mechanism such as a flat zone aligner 11 provided in the semiconductor wafer testing apparatus. There, the semiconductor wafers are aligned such that the flat zone of each wafer faces a given direction. The wafer alignment mechanism is generally either a three-dimensional coordinate type or a roller type, of which the three-dimensional coordinate type is coming into more common use. The alignment is performed by rotating each wafer until a photosensor senses the flat zone of each wafer, at which time the rotation of the wafers stops.

The carrier containing the aligned wafers is then placed on an identification (ID) finder 12. The ID finder 12 is used to identify the semiconductor wafers. The ID finder 12 arranges the wafers in tiers, which makes it easy to see wafer codes which are located on an upper portion of the flat zone of each wafer, and to thereby find a desired one of the wafers. The wafer identification is necessary because the sampling inspection will be made on a wafer with a predetermined wafer code that is preselected from a lot of wafers, and the wafer with the predetermined number is not always placed in the same spot within the carrier during the sampling inspection.

Once the operator finds a wafer 10 with the predetermined wafer code, he removes it from the carrier with tweezers and puts it into another carrier which is laid on a carrier stage 13. Then, the operator works the keyboard of a controller 14, and according to the keyboard input, an autoloader 15 of the wafer testing apparatus takes the wafer from the carrier stage 13 and places it onto a stage of a microscope 16. The operator checks to see if there is any defect in the wafer by the use of a monitor 18 connected to a microscope camera 17. Following the inspection, the wafers are again loaded on the original carrier in the reverse order for subsequent processing.

According to the conventional wafer testing apparatus, the flat zone aligner and the ID finder are needed to locate the preselected wafer for testing, and the operator must visually select the wafer with the predetermined wafer code and move it to the carrier stage by hand. During this processing, as the operator looks closely at the wafer to see its code, contamination from the operator may be generated as well as particulate dust due to the use of the tweezers, which contamination may cause problems in subsequent processing.

Accordingly, several methods of automatically recognizing a wafer with a predetermined wafer code have been proposed in order to solve this problem.

Of the recently-developed methods, one employs optical character recognition. An optical character recognizer is used with presently-available wafer sorters. The wafer sorter is used to arrange the wafers that are mixed up in the carrier.

Referring to FIG. 2, a system using an optical character recognizer is now described hereinafter.

A first carrier 21 in which wafers 20 are mixed up after processing is placed on one side of a work table 28 of the wafer sorter, with the wafers in a horizontal position. An autoloader 22 installed on the center of the work table 28 picks up the wafers one by one out of the first carrier 21 and puts them on a spin chuck 23 of the work table 28. The spin chuck 23 rotates and allows the wafers to be aligned in order that their flat zones face a given direction by using a sensor 24 for sensing the flat zone of each wafer. This alignment mechanism is substantially similar to the conventional three-dimensional coordinate type.

Then an optical character recognizer 25 reads out the respective codes on the flat zones of each wafer and sends the codes to a controller 26. The controller 26 then drives the autoloader 22 to convey the wafers to slots of a second carrier 27, with slot placement corresponding to wafer codes of each wafer.

When the optical character recognizer used for such a wafer sorter is employed in a semiconductor wafer testing apparatus, wafer recognition must wait until the wafers have been conveyed one at a time from the carrier to the spin chuck for wafer alignment. Accordingly, a lot of time is required for completion of the overall processing.

SUMMARY OF THE INVENTION

The present invention provides a semiconductor wafer testing apparatus which can perform wafer alignment and wafer recognition at a combined processing station under automatic control, thereby preventing contamination from the operator and dust contaminants due to the use of tweezers that may degrade the reliability of the semiconductor devices.

The present invention also provides a semiconductor wafer testing apparatus which employs an improved optical character recognizer so as to reduce the time for finding a desired wafer in a carrier.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention discloses a semiconductor wafer testing apparatus having a work table on which a carrier containing semiconductor wafers to be checked is placed, a microscope which makes enlarged images of the semiconductor wafers for inspection, a robot arm that conveys the semiconductor wafers in the carrier to the microscope stage, and a controller that has control over the operation of each part. The semiconductor wafer testing apparatus includes a wafer flat zone aligner which has a pair of rotating roller pins, each coming in contact with circumferences of the wafers being stacked in the carrier through an open lower part of the carrier. The apparatus also includes an optical character recognizer that moves up and down and forward and backward with respect to the carrier, and interposes between the wafers in the carrier so as to read out codes which are on each wafer.

According to the present invention, the optical character recognizer should perform its operation precisely and promptly with the up-and-down or forward-and-backward movement below and into the carrier containing the semiconductor wafers.

In order to facilitate the above-described operation, it is preferable that parts of the optical character recognizer that make large movements or interpose between the wafers be thin and light. In addition, preferably, motors for actuating these parts are designed to be easily and precisely controlled.

The inventive wafer testing apparatus has a microscope camera which takes photographs of the images of the wafers enlarged by the microscope, and a monitor which displays their images upon receipt of an output signal of the camera, which makes it easy to see if there is any defect in the semiconductor wafers.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention, in which:

FIG. 1 schematically depicts a conventional semiconductor wafer testing apparatus;

FIG. 2 schematically depicts a wafer sorter employing a conventional optical character recognizer;

FIG. 3 schematically depicts a semiconductor wafer testing apparatus in accordance with a preferred embodiment of the present invention;

DETAILED DESCRIPTION OF PREFERRED EMBODIMENT

Reference will now be made in detail to a preferred embodiment of the present invention, examples of which are illustrated in the accompanying drawings.

Figure 1:
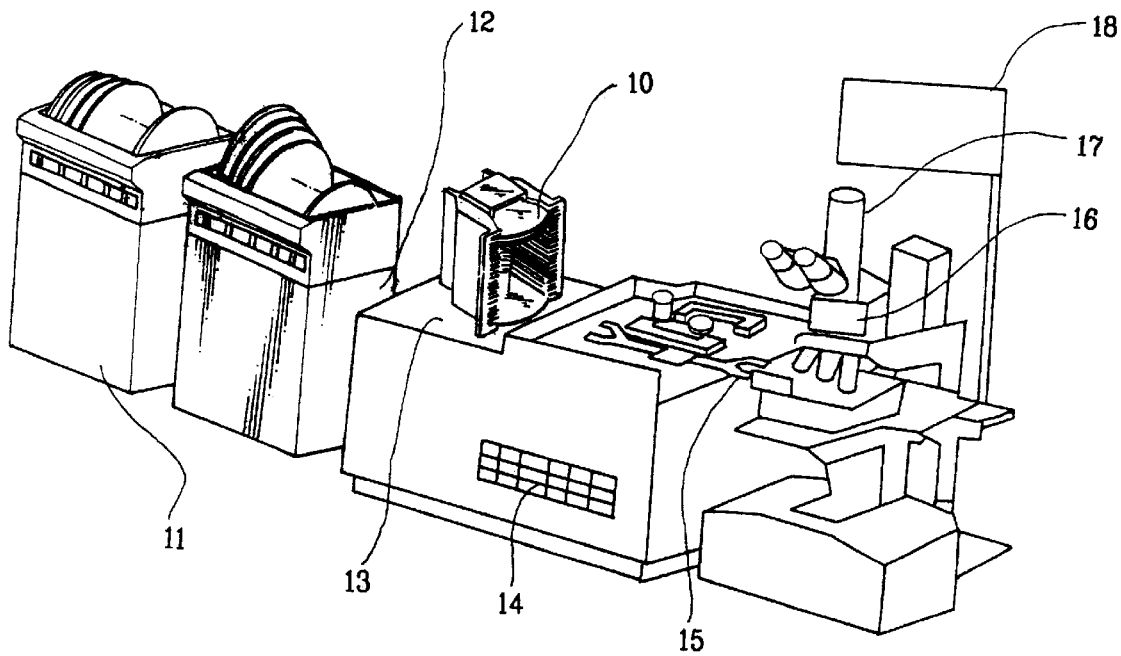
Figure 2:
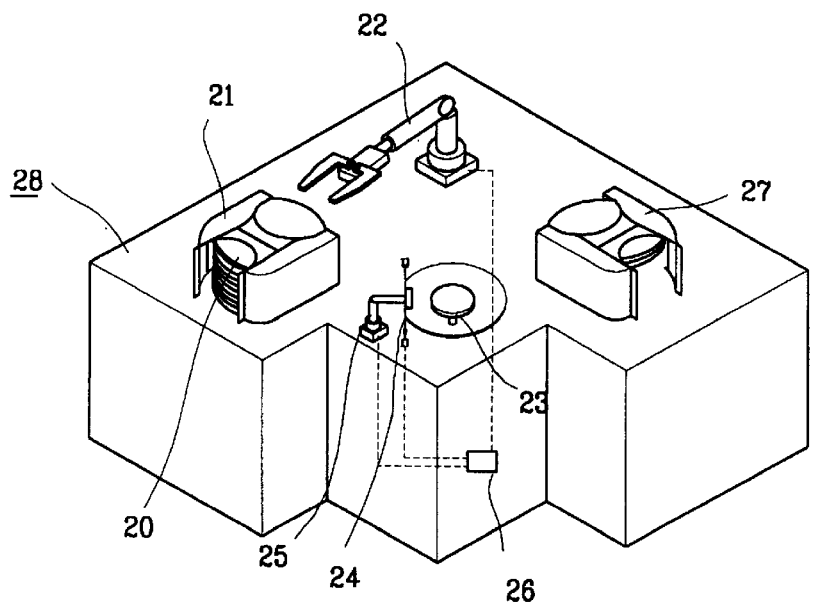
Figure 3:
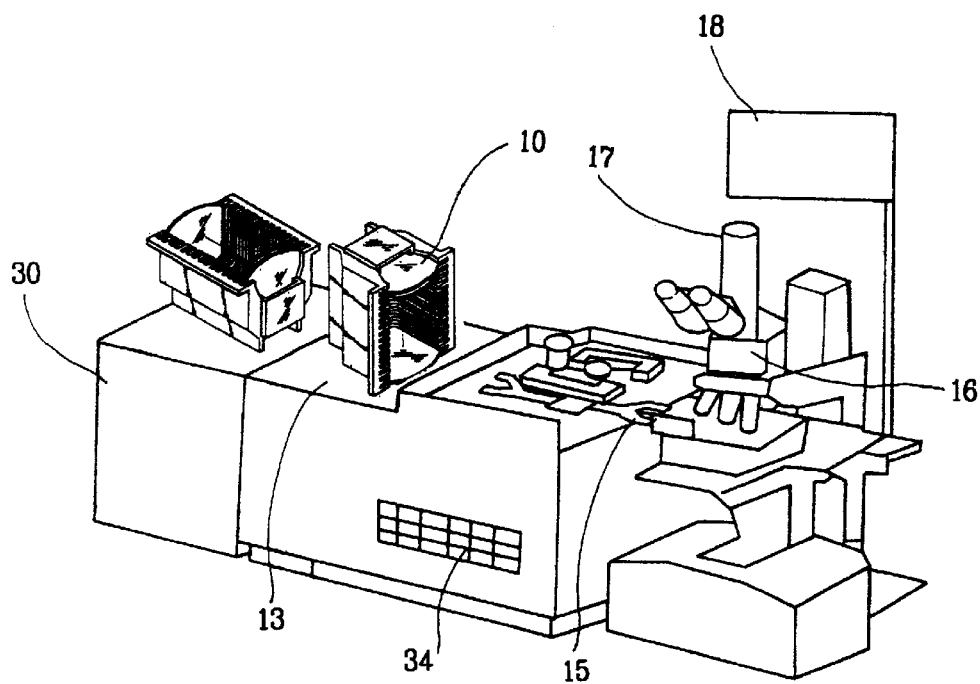

Referring to FIG. 3, the inventive semiconductor wafer testing apparatus includes an autoloader 15 which is a robot arm, a microscope 16, a microscope camera 17, a monitor 18 and a controller 34. This apparatus is substantially similar to the conventional elements having like or similar references numerals as shown in FIG. 1.

However, as shown in FIGS. 3 through 6, the testing apparatus of this preferred embodiment has one work table 30 having an opening therein in which a flat zone aligner 51 and an optical character recognizer 61 are both provided for movement into and out of the table opening; while the conventional testing apparatus requires one work table 11 for wafer alignment and a separate table on which an identification (ID) finder 12 is installed.

According to the inventive semiconductor wafer testing apparatus, wafers on the work table 30 can be directly moved to a stage of microscope 16 by the autoloader without any special preparation.

Figure 4:
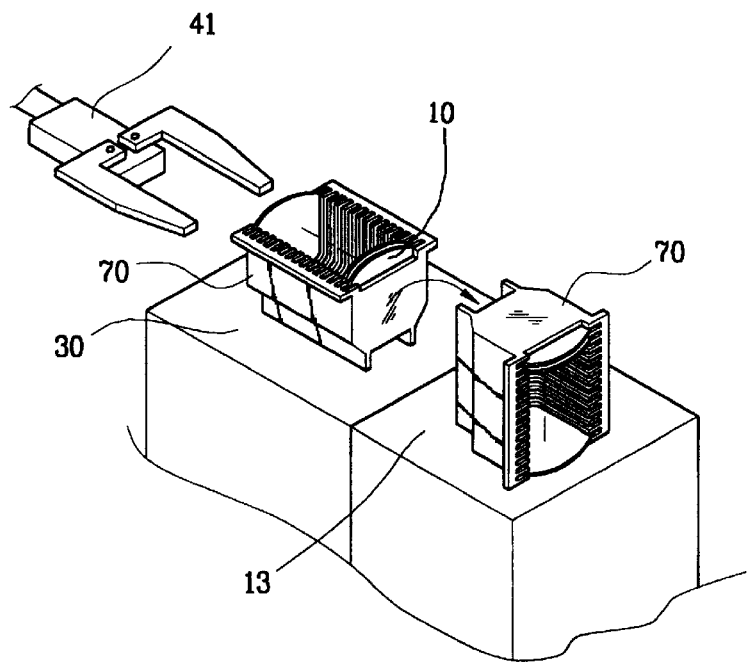
FIG. 4 illustrates the step of moving a carrier laid on a work table of the inventive semiconductor wafer testing apparatus to a carrier stage.

As shown in FIG. 4, the wafers 10 first enter the apparatus in a carrier 70 placed onto the work table 30, where the wafers 10 are in a vertical orientation. After alignment by the flat zone aligner 51 and recognition by the optical character recognizer 61 as described below, the carrier 70 is turned on end by a carrier conveyer 41 so as to move the wafers into a horizontal orientation onto a carrier stage 13, so that the autoloader 15 can convey a corresponding wafer 10 contained in the carrier 70 on the carrier stage 13 to the stage of the microscope 16. This turning step is required because the wafers 10 are vertically arranged in the carrier 70 for alignment and recognition, and most robot arms used for wafer conveyance are designed to be in the form of the above autoloader 15 that require the wafers to be arranged horizontally.

Figure 5:
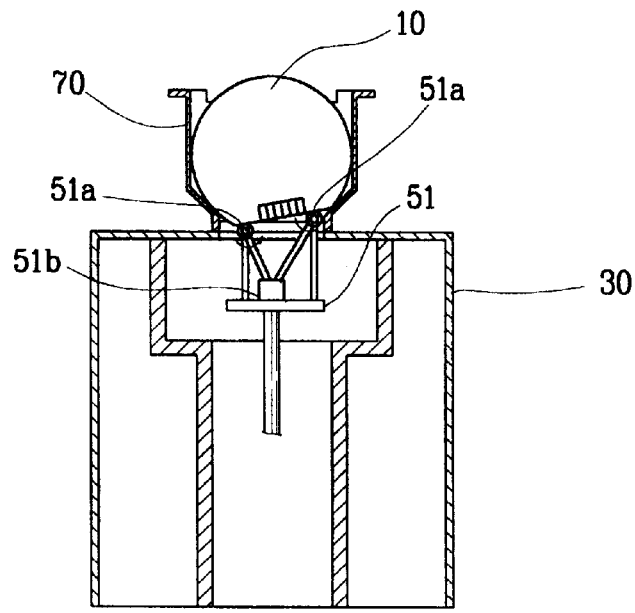
FIG. 5 is a sectional end view of a flat zone aligner of the present invention.

Referring to FIG. 5, the alignment function of flat zone aligner 51 will be described. The semiconductor wafers 10 are vertically oriented in the carrier 70 on the work table 30, and a pair of roller pins 51a of the flat zone aligner 51 installed in the work table 30 ascend and come in contact with the circumferences of the wafers through an open lower part of the carrier 70. The roller pins 51a are rotated by a first electric motor 51b. Since the distance between the two roller pins 51a is smaller than the length of each wafer flat zone, the wafers 10 turn with the rotation of the roller pins 51a. When the roller pins 51a get to the wafer flat zones, the wafers 10 stop rotating. Accordingly, as the roller pins 51a rotate for a predetermined period of time, all of the wafers 10 become aligned in the carrier 70.

Figure 6:
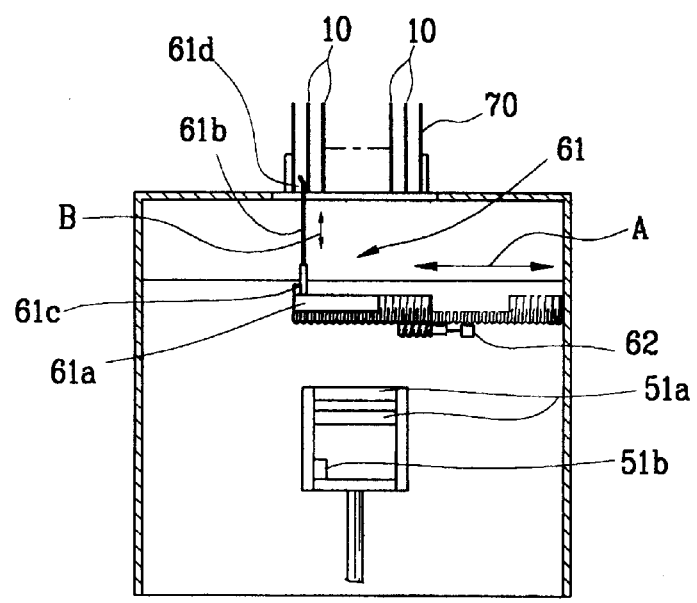
FIG. 6 is a sectional side view of an optical character recognizer in accordance with the present invention.
Figure 7:
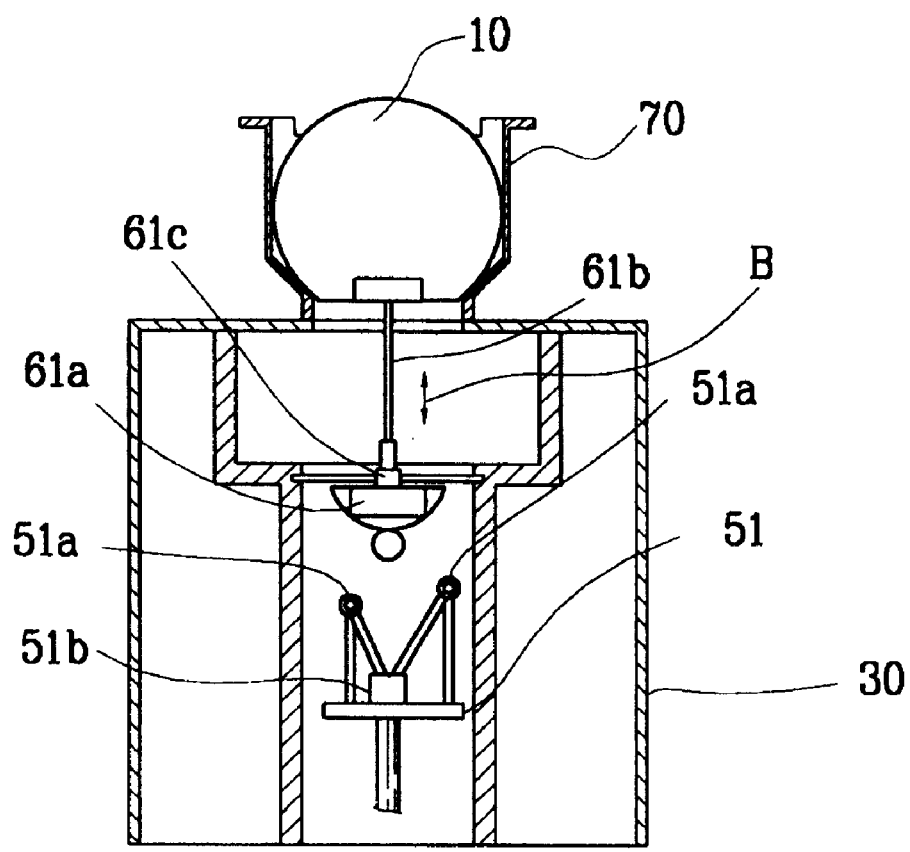
FIG. 7 is a sectional end view of the inventive optical character recognizer of FIG. 6.

Referring to FIGS. 6 and 7, after the alignment of the wafers in the carrier 70, the roller pins 51a of the flat zone aligner 51 descend to the lower part of the work table 30, and an optical character recognizer 61 standing ready under the carrier is moved to one end of the carrier 70 with a second electric motor 62 by horizontally moving the optical character recognizer 61 forward or backward below the carrier in the direction of horizontal arrow 'A' in FIG. 6.

The optical character recognizer 61 includes a main body having a reader 61a formed therein which moves horizontally with the optical character recognizer 61. The main body also has a reflector rod 61b which is disposed around a window 61c of the reader 61a, and protrudes upward from the main body. The reflector rod 61b has a reflector 61d on the free end thereof, and the reflector 61d and reflector rod 61b move up-and-down as indicated by the vertical arrow 'B' in FIG. 6.

After the initial movement of optical character recognizer 61 toward one end of the carrier 70 is completed, the reflector rod 61b protruding upward from the main body is raised (see arrow 'B') to face a flat zone of a first semiconductor wafer 10 through the open lower part of the carrier 10. The reflector 61d attached to the tip of the reflector rod 61b, which can be viewed through window 61c of the reader 61a, reflects the wafer code on the upper part of the flat zone to the reader 61a so that the reader 61a reads out the wafer code.

The controller 34 makes a comparison between the wafer code read out by the reader 61a and the wafer code input through the controller 34. It is preferable that a light source for lighting up each character part of the wafers is provided on the reflector 61d or the window 61c of the main body.

When the read-out wafer code and the input wafer code correspond, the controller 34 determines that the first wafer 10 in the carrier 70 is the desired one, and allows the autoloader 15 to convey the first wafer 10 to the microscope 16 stage from the carrier stage 13 after the entire carrier 70 has been turned on end by carrier conveyor 41.

When the read-out wafer code and the input wafer code do not correspond, the reflector rod 61b returns to its original position (see arrow 'B'), and the second motor 62 moves the main body of the optical character recognizer 61 along the direction of arrow 'A' for an interval corresponding to the carrier slot pitch. The reflector rod 61b then moves upward again to be opposite to an upper part of a flat zone of a second wafer, and reflects the code on the upper part flat zone of the second wafer to the reader 61a so that the reader 61a reads out the wafer code. This process continues until the desired wafer with the predetermined wafer code is found in the carrier.

Figure 8:
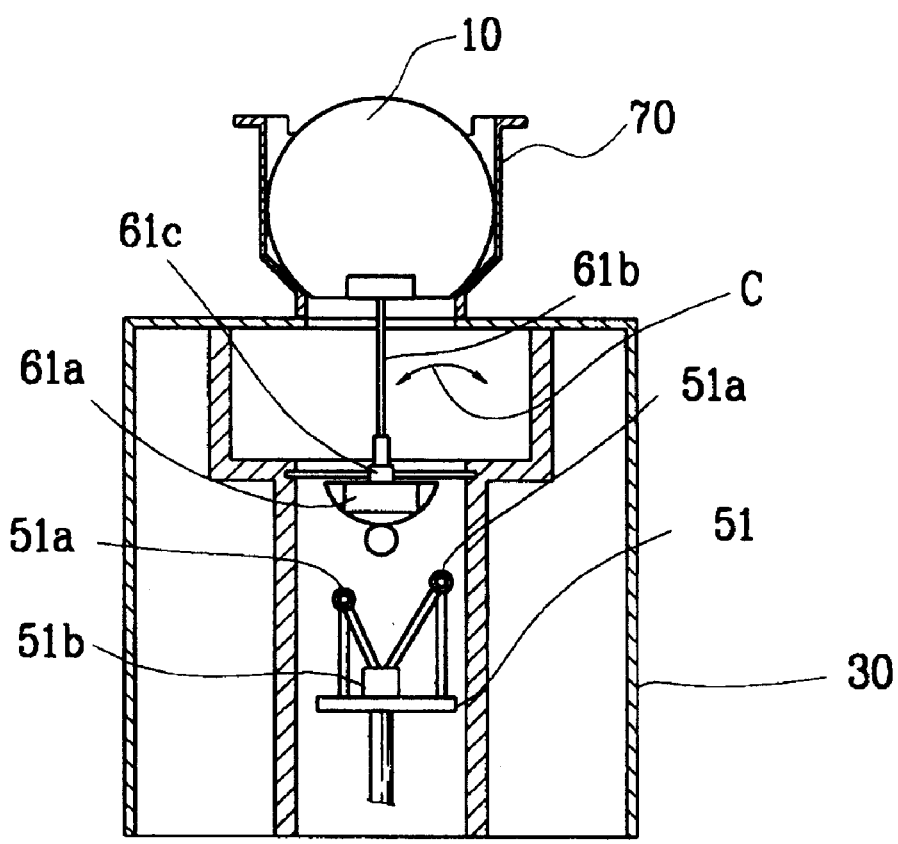
FIG. 8 is a sectional end view of a second embodiment of the optical character recognizer of the present invention.

In this preferred embodiment, the reflector rod 61b moves up-and-down as shown by arrow 'B' in FIG. 6 and FIG. 7. This reflector rod 61b, however, may be rotatably fixed to the center of the main body of the optical character recognizer 61, and designed to rotate from side to side along the direction of arrow 'C' in FIG. 8, thereby interposing between the wafers 10 in order to recognize characters forming the wafer codes and then moving out of the interposed position.

A given semiconductor wafer conveyed to the microscope stage by the autoloader 15 is enlarged by means of the microscope camera 17, and its enlarged image is transferred to the monitor 18 for the inspection. Semiconductor wafers in which no defect is found are arranged in the carrier 70 in the reverse order for subsequent processing.

As described above, the inventive semiconductor wafer testing apparatus performs the overall process under automatic control to thereby prevent contamination from the operator and particulate dust due to the use of tweezers. In addition, optical character recognition is carried out automatically while the semiconductor wafers are being stacked in the carrier, which reduces the overall time required for the inspection process.

It will be apparent to those skilled in the art that various modifications and variations can be made in the semiconductor wafer testing apparatus of the present invention without departing from the spirit or scope of the invention. Thus, it is intended that the present invention cover the modifications and variations of this invention that come within the scope of the appended claims and their equivalents.

What is claimed is:

1. A semiconductor wafer testing apparatus comprising:
   a work table, having an opening therein, on which a carrier containing semiconductor wafers to be checked is placed;
   a microscope for making enlarged images of the semiconductor wafers for inspection;
   a robot arm for conveying the semiconductor wafers in the carrier to a stage of the microscope;
   a wafer flat zone aligner situated below the table opening having a pair of rotating roller pins, each coming in contact with circumferences of the wafers in the carrier through the table opening and an open lower part of the carrier;
   an optical character recognizer situated below the table opening and moving forward and backward below the carrier, and moving through the table opening into and out of the open lower part of the carrier, such that movement of said optical character recognizer interposes said optical character recognizer between each of the wafers in the carrier so as to read out code numbers located on each wafer, and
   a controller for controlling operation of the microscope, the robot arm, the wafer flat zone aligner, and the optical character recognizer.

2. The semiconductor wafer testing apparatus according to claim 1, further comprising:
   a carrier stage on which the carrier is placed so that the robot arm conveys a predetermined one of the wafers to the microscope stage after wafer alignment and optical character recognition processes are completed on the work table; and
   a carrier conveyer for turning and moving the carrier laid on the work table to said carrier stage so as to turn the wafers in said carrier from a vertical orientation to a horizontal orientation relative to a top surface of said carrier stage.

3. The semiconductor wafer testing apparatus according to claim 2, said optical character recognizer further comprising:
   a window formed on a main body of the optical character recognizer to sense images of wafer codes;
   a reader reading out the images of the wafer codes input through the window; and
   a reflector rod installed around the window and protruding upward from said main body and having a reflector on its end, said reflector reflecting the wafer codes to the reader through the window so that the reader reads out the wafer codes.

4. The semiconductor wafer testing apparatus according to claim 3, wherein up-and-down movement of said reflector rod interposes the reflector between the wafers in the carrier as said reflector rod moves upward, and as said reflector rod moves downward it retracts from the wafers.

5. The semiconductor wafer testing apparatus according to claim 3, wherein said reflector rod is rotatably fixed to the main body of the optical character recognizer so that the reflector rod repeatedly rotates the reflector into a position so as to interpose between the wafers and then rotates the reflector out of the interposed position.

6. The semiconductor wafer testing apparatus according to claim 1, said optical character recognizer further comprising:
   a window formed on a main body of the optical character recognizer to sense images of wafer codes;
   a reader reading out the images of the wafer codes input through the window; and
   a reflector rod installed around the window and protruding upward from said main body and having a reflector on its end, said reflector reflecting the wafer codes to the reader through the window so that the reader reads out the wafer codes.

7. The semiconductor wafer testing apparatus according to claim 6, wherein said reflector rod is rotatably fixed to the main body of the optical character recognizer so that the reflector rod repeatedly rotates the reflection into a position so as to interpose the reflector between the wafers and then rotates the reflector out of the interposed position.

8. The semiconductor wafer testing apparatus according to claim 6, wherein up-and-down movement of said reflector rod interposes the reflector between the wafers in the carrier as said reflector rod moves upward, and as said reflector rod moves downward it retracts from the wafers.

* * * * *